United States Patent
Su et al.

(10) Patent No.: US 12,424,506 B2
(45) Date of Patent: Sep. 23, 2025

(54) SPRING FINGER RING LASER WELDED ON A DIE CAST PART SERVING AS AN AIR TRANSMISSIVE SHIELDING WALL

(71) Applicant: Plume Design, Inc., Palo Alto, CA (US)

(72) Inventors: Ming-Tsung Su, Taipei (TW); Yuhan Liu, Taipei (TW)

(73) Assignee: PLUME DESIGN, INC., Palo Alto, CA (US)

( * ) Notice: Subject to any disclaimer, the term of this patent is extended or adjusted under 35 U.S.C. 154(b) by 208 days.

(21) Appl. No.: 18/147,681

(22) Filed: Dec. 28, 2022

(65) Prior Publication Data
US 2024/0222220 A1  Jul. 4, 2024

(51) Int. Cl.
*H01L 23/367* (2006.01)
*H01L 23/373* (2006.01)
*H01L 23/40* (2006.01)
*H01L 23/42* (2006.01)
*H01L 23/552* (2006.01)
*H01L 23/60* (2006.01)

(52) U.S. Cl.
CPC ........ *H01L 23/367* (2013.01); *H01L 23/3672* (2013.01); *H01L 23/3736* (2013.01); *H01L 23/4093* (2013.01); *H01L 23/42* (2013.01); *H01L 23/552* (2013.01); *H01L 23/60* (2013.01)

(58) Field of Classification Search
CPC .......................... H01L 23/552; H01L 23/3672
See application file for complete search history.

(56) References Cited

U.S. PATENT DOCUMENTS

| | | | |
|---|---|---|---|
| 2003/0067757 A1* | 4/2003 | Richardson | H01L 23/50 257/E23.079 |
| 2015/0201533 A1* | 7/2015 | Daughtry, Jr. | H05K 9/0032 29/840 |
| 2021/0175183 A1* | 6/2021 | Lo | H01L 23/552 |

* cited by examiner

*Primary Examiner* — Eric S Ruppert
(74) *Attorney, Agent, or Firm* — Nicholas Martin; Greenberg Traurig, LLP

(57) ABSTRACT

A heat sink assembly for dissipating heat in a chipset comprising a shield cover having a void and a heat sink that at least partially fills the void in the shield cover. The heat sink protruding through the shield cover and pressed against the chipset with a single layer thermal pad between. The heat sink assembly including a shielding wall consisting of a plurality of elastic spring fingers, the spring fingers arranged around the periphery of the shielding wall base and in contact with the heat sink and the shield cover wherein the shielding wall encircles the chipset and is positioned between the shield cover and the heat sink. The shielding wall providing Electromagnetic Interference (EMI) and noise shielding in addition to optimizing thermal convection for the chipset.

20 Claims, 8 Drawing Sheets

SPRING FINGER RING LASER WELDED ON A DIE CAST PART SERVING AS AN AIR TRANSMISSIVE SHIELDING WALL

FIELD OF THE DISCLOSURE

The present disclosure generally relates to electronic hardware systems and methods. More specifically, the present disclosure relates to a spring finger ring that is laser welded on a die cast part which serves as an air transmissive shielding wall in an electronic device, such as a Wi-Fi Access Point (AP).

BACKGROUND OF THE DISCLOSURE

Recently, the demand for small form electronic devices such as a Wi-Fi Access Point (AP) for mobile wireless applications has increased dramatically, this is driven in part by the Internet of Things (IoT) market. IoT devices include sensors, processing ability, and software applications that connect and exchange data with other devices over the internet or other similar communication networks. Small form AP's raise challenging issues for design and implementation. Placement of the required circuitry and components in close proximity without causing degradation of performance due to Electro-Magnetic Interference (EMI) is a challenge. Additionally, the small size of the electronic device and close proximity of devices make it difficult to maintain approved operating temperature ranges for components.

Integrated circuit (IC) chips or chipsets are built on a small single block of a semiconductor and include several components such as resistors, capacitors, diodes, and transistors. Chipsets are fabricated with layers of components, metal, or insulators all built upon a base layer of silicon. Chipsets are often attached to a printed circuit board (PCB) via a surface mounting technology (SMT). One SMT technology for surface mounting chipsets is called the Ball Grid Array (BGA), it includes using small solder balls on the underside of the chipset to connect to the PCB. As chipset components get smaller in size and operate at faster speeds the heat generated by the components on a single chipset during normal operation is dissipated into a smaller and more confined space. The small surface area and tightly packed components make it difficult to maintain component temperatures within the approved operating range. The modern chipset requires the assistance of heat dissipation and cooling means which is typically performed by passive heat sinks.

The use of heat sinks to conduct heat away from components, thereby reducing their operating temperature is well known in the industry. Heat sinks are generally mounted on a heat source to absorb and dissipate heat within a component. Airflow is designed as part of the surrounding environment in order to allow airflow across the heat sink, this can be done passively or by forcing air with fans. A passive heat sink relies on natural convection wherein the buoyancy of hot air causes the airflow generated across the heat sink. These passive heat sink systems do not rely on power or control systems to help dissipate heat. Active heat sinks rely on forced air to increase airflow across the heat sink and rely on fans or coolers which require power and often control components. A typical electronic device includes many heat sinks both on individual components as well as heat sinks for the overall electronic device enclosure. In regard to chipsets, the heat sink is typically attached to the top of the chipset as the bottom of the chipset is used for connecting to the PCB with a SMT method such as BGA.

Yet another challenge for designing and implementing chipsets in an electronic device include electromagnetic interference (EMI) or noise between the chipset and other components. EMI and noise is a disturbance generated by an external source that affects electrical circuitry by electromagnetic induction, electrostatic coupling, or conduction. The EMI and noise can degrade the performance of components and in extreme cases can stop the functionality of the component. Considering electronic devices include many different components such as antennas, chipsets, radios, and circuitry there needs to be noise shields/barriers that exist within the enclosure. A typical solution for providing shielding for a chipset includes a metallic shield cover that surrounds the chipset and is designed to block or reduce EMI from penetrating through the shield cover. The heat sink and the shield cover associated with the individual chipsets that are part of the overall electronic device can work against each other as the shield cover can interfere with the heat sink's ability to dissipate heat.

As electronic devices become more compact and as chipsets that are integrated as part of the electronic device become smaller and operate at faster speeds there exists a need for efficient design and implementation for EMI/noise shielding as well as efficient heat dissipation methods. The combination of the heat sink and the shielding means deployed for an individual chipset is referred to as a heat sink assembly and is assembled and arranged to provide heat dissipation in addition to EMI/noise shielding. The heat sink and EMI/noise shielding (heat sink assembly) is developed to operate with minimal effect on one another to optimize the chipset performance and keep the chipset under the operating temperature range.

BRIEF SUMMARY OF THE DISCLOSURE

The present disclosure generally relates to electronic hardware systems and methods. More specifically, the present disclosure relates to a spring finger ring that is laser welded on a die cast part which serves as an air transmissive shielding wall in an electronic device, such as a Wi-Fi Access Point (AP). This shielding wall provides EMI/noise blocking and also optimizes thermal convection for the chipset.

In an embodiment, a heat sink assembly for dissipating heat in a chipset includes a shield cover having a void present above the chipset; a heat sink that partially or fully occupies the void in the shield cover allowing the heat sink to be pressed against the chipset with a single layer thermal pad between; and a shielding wall including a plurality of elastic spring fingers, the spring fingers arranged around the periphery of a base of the shielding wall and in contact with the heat sink and the shield cover; wherein the shielding wall encircles the chipset and is positioned between the shield cover and the heat sink to provide Electromagnetic Interference (EMI)/noise shielding in addition to providing thermal convection for the chipset.

The plurality of elastic spring fingers can have an air gap between one another for heat to escape and to block EMI/noise from penetrating the chipset. The plurality of spring fingers can have elasticity and aid in compressing the heat sink to the chipset. The shielding wall can include a ring of elastic arms where one end of the arm is stationary and laser welded onto the heat sink and the other end is the spring finger contact point in contact with the shield cover. The stationary arm and the elastic arm together can form a U shape and provide elasticity at the spring fingers. The spring finger ring can be a metallic material. The metallic material can be stainless steel.

The chipset can be in contact with the PCB on one end by surface mounting technology. The mounting technology can be a ball grid array (BGA). The chipset can be in contact with the heat sink via a thermal pad. The heat sink can be an aluminum die cast. The spring finger shielding wall can be electrically connected to ground through a plurality of points around the ring. A plurality of heat sink assemblies can be implemented in a single electronic device.

In another embodiment, a method of providing a heat sink assembly for dissipating heat in a chipset includes providing a shield cover having a void present above the chipset; placing a heat sink partially or fully over the void in the shield cover allowing the heat sink to be pressed against the chipset with a single layer thermal pad between; and providing a shielding wall including a plurality of elastic spring fingers, the spring fingers arranged around the periphery of a base of the shielding wall and in contact with the heat sink and the shield cover; wherein the shielding wall encircles the chipset and is positioned between the shield cover and the heat sink to provide Electromagnetic Interference (EMI)/noise shielding in addition to providing thermal convection for the chipset.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Figure 1:
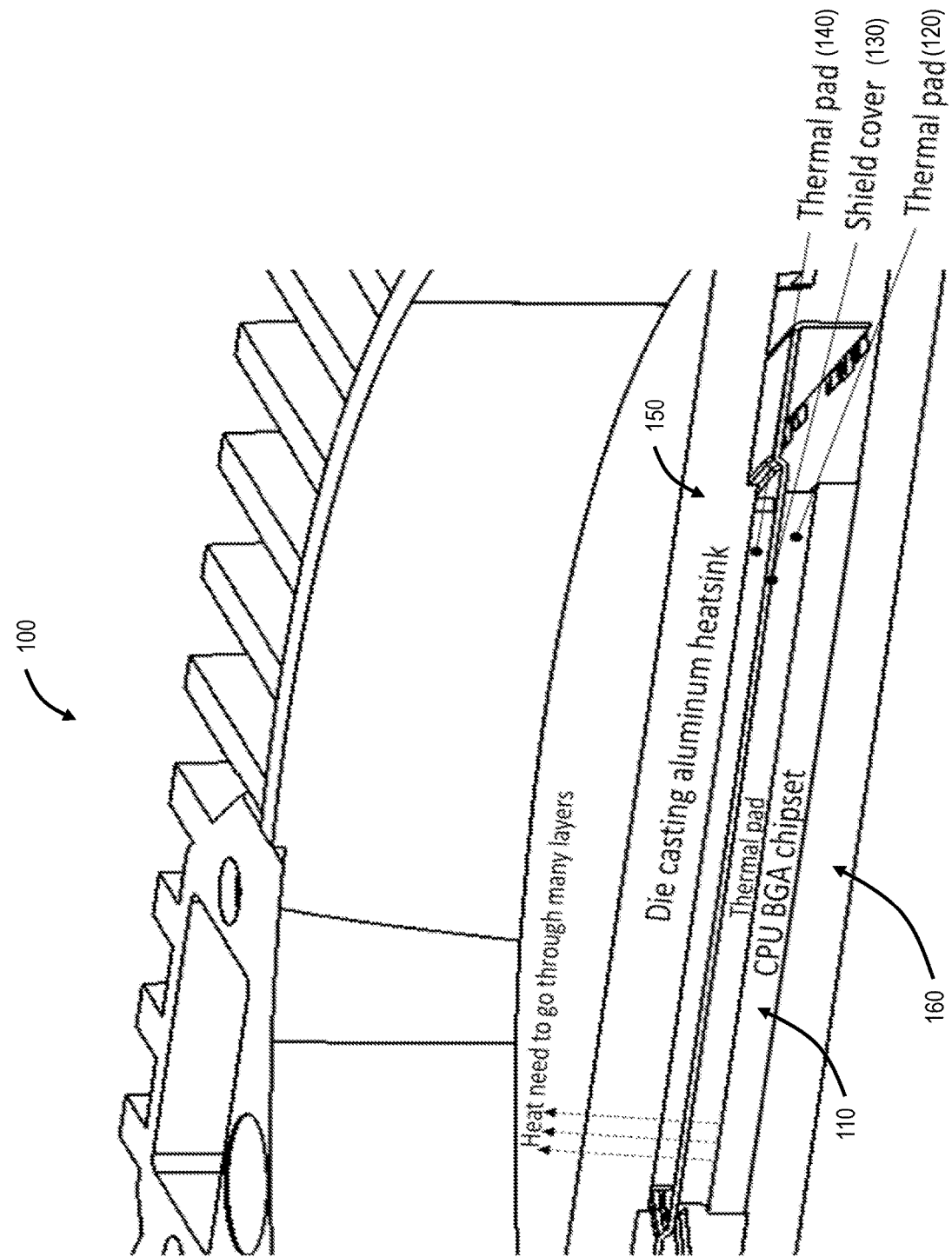
FIG. 1 is a sectional view of an existing industry electronic device including a chipset implemented with heat sink and EMI shielding.

In various embodiments, the present disclosure generally relates to electronic hardware systems and methods. More specifically, the present disclosure relates to a spring finger ring laser welded on a die cast part which serves as an air transmissive shielding wall in an electronic device, such as a Wi-Fi Access Point (AP). The air transmissive shielding wall encircles the chipset and is positioned between the shield cover and the heat sink to provide Electromagnetic Interference (EMI) and noise shielding in addition to optimizing thermal convection for the chipset.

Thermal Management in Electronic Devices

Electronic devices generate excess heat derived from the power and processing components that comprise of the electronic device. Components such as chipsets have many different subcomponents that work together to achieve a specific function of operation. A chipset is a collection of integrated circuits (IC) that manages data flow between the processor, memory, and peripherals. Chipsets are built on a small single block of a semiconductor and include many different subcomponents and circuitry. Heat is generated by chipsets based on the work that is performed within, heat generated is magnified as subcomponents such as transistors get smaller and provide more computing power per area of chipset. Chipsets have a normal operating temperature range in which they can operate and not cause the chipset to degrade, become unreliable, or fail entirely. Chipsets and other individual components inside an electronic device require thermal management to improve reliability and prevent premature failure, this includes dissipating heat away from the component and exhausting that heat from the electronic device.

There exist three forms of heat dissipation in thermodynamics which include conduction, convection, and radiation. The most common used heat transfer methods for heat dissipation and cooling in electronic devices utilize the phenomena of conduction and convection. Conduction is the heat transfer principal where heat energy is transferred by direct contact whereas convection is the movement of heat by actual motion of matter. The heat transfer of conduction is slow and takes place due to the difference in temperature of the objects. Conduction depends on temperature gradient, cross section of the material, length of the travel path, and physical material properties. Alternatively, transfer by convection is faster and occurs due to the difference in density of the objects. Convection occurs when air or liquid is heated than travels away from the source carrying thermal energy on its path. Radiation is the transfer of energy by means of electromagnetic waves, radiation will not be discussed in the disclosed as the solution presented uses the heat dissipation principals of conduction and convection.

As described previously, one of the variables in heat dissipation by conduction is the physical material properties. Thermal conductivity of a material is a measure of its ability to conduct heat and is typically denoted by units of W/mk (Watts per meter-kelvin). Heat transfer occurs at a lower rate in materials of low thermal conductivity, for instance, metals typically have high thermal conductivity and are very efficient at conducting heat, while insulating materials are less efficient at conducting heat. Thermal resistance is another thermal property of a material and is the measure of how a material of a specific thickness resists the flow of heat. Thermal resistance and thermal conductivity are the inverse of one another.

The use of heat sinks to conduct heat away from components, thereby reducing their operating temperature is well known in the industry. Heat sinks are generally mounted on a heat source to absorb and dissipate heat within a component. Airflow is designed as part of the surrounding environment in order to allow airflow across the heat sink, this can be done passively or by forcing air with fans. A passive heat sink relies on natural convection wherein the buoyancy of hot air causes the airflow generated across the heat sink. A typical electronic device includes many heat sinks both on individual components as well as heat sinks for the overall electronic device. A thermal interface material such as a thermal pad is often used to fill the gaps that may be present between thermal transfer surfaces such as between chipsets and heat sinks. Thermal pads increase thermal transfer efficiency by having a higher thermal conductivity value (lower thermal resistance).

Existing Industry Chipset Thermal Management Implementation

FIG. 1 is a sectional view of an existing industry electronic device including a chipset implemented with a heat sink for dissipating heat and shielding for blocking EMI/noise. This electronic device can be a number of different types of electronic devices including but not limited to a Wi-Fi Access Point (AP), an IOT device, or similar. As shown 100 the typical installation of the chipset 110 is installed on top of the printed circuit board (PCB) 160 by using a surface mounting technology (SMT). The chipset 110 shown in this figure utilizes the ball grid array (BGA) method which is a chipset package with the underside covered or partially covered with solder spheres or balls. These solder spheres conduct electrical signals between the chipset circuits and the PCB 160. During the installation process the chipset is placed on a PCB with copper pads in a pattern that matches the solder spheres. The solder balls are heated and cooled thereby solidifying the soldered connections between the chipset 110 and the PCB 160. The BGA surface mounting method was derived from the pin grid array (PGA) method which uses pins on the underside the chipset and through holes on the PCB where the pins get inserted to make the electrical connection between the chipset 110 and the PCB 160.

Located on top of the chipset 110 exists a lower thermal pad 120 placed between the chipset 110 and the shield cover 130. The thermal pad 120 contacts the chipset 110 and the shield cover 130 and typically includes a rubbery heat conductive layer. This thermal pad layer forms a continuous heat path from the surface of the chipset 110 to the shield cover 130. The thermal pad assists in transferring heat from the component in contact below to the component in contact above and improves thermal transfer efficiency. The shield cover 130 is necessary to prevent the chipset 110 in the electronic device from radiating undesired signals/noise and to prevent EMI/noise from penetrating the chipset 110. Located above and pressed against the shield cover 130 is an upper thermal pad 140 which forms a continuous heat path from the surface of shield cover 130 to the heat sink 150. The heat sink absorbs the heat conducted by the chipset 110 after rising and traveling through the many layers including lower thermal pad 120, shield cover 130, and upper thermal pad 140. Airflow along the top of the heat sink 150 is designed as part of the overall electrical device, however whether the airflow is passive or active it is designed to introduce cooler air along the surface of the heat sink 150 and dissipate the heat that is absorbed by the heat sink 150. That heat is than removed from the chipset 110 and dissipated into the enclosure environment or exhausted from the electronic device by many different means. The many layers that exist (lower thermal pad 120, shield cover 130, and upper thermal pad 140) between the chipset 110 and the heat sink 150 reduce the thermal conduction efficiency as the most efficient way of dissipating heat from the chipset 110 would be if the chipset were in direct contact with the heat sink 150 without the many layers between.

The assembly of the components in the electronic device 100 is completed in stages. The incremental assembly of components inside the electronic device includes fastening the components with screws, clamps, or similar. Soldering of components also occur such as the soldering that occurs with the BGA chipset 110. The more layers that exist between chipset 110 and heat sink 150 can also affect assembly time and cost of the electronic device.

Figure 2:
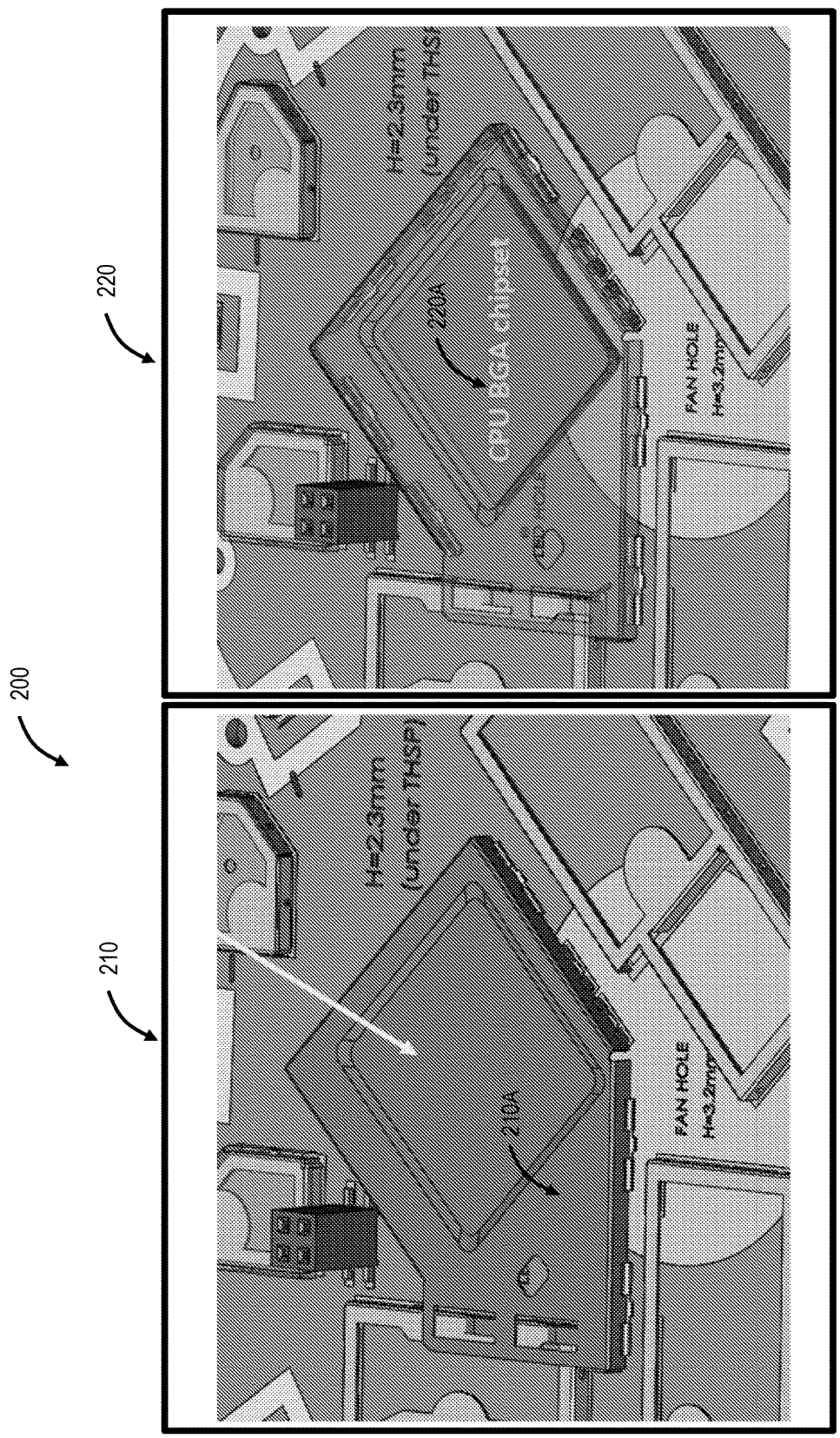
FIG. 2 is a detailed view of the chipset and shield cover implemented into an existing industry electronic device.

FIG. 2 is a detailed view of the BGA chipset and shield cover implemented into an existing industry electronic device. The typical installation of the chipset includes surface mounting the chipset to the PCB utilizing technology such as BGA which is shown in 200. This view 200 depicts the same chipset installed on the PCB, wherein the view 210 shows the shield cover 210A installed over the chipset. The chipset in 210 is not shown as it is located directly underneath the shield cover 210A, and the shield cover 210A is typically a one piece component that covers the entirety of the footprint of the chipset. As depicted in 220 the shield cover is shown transparent in order to depict the chipset 220A which is mounted on the PCB. As depicted in 100 the component layers that exist include the chipset 110, lower thermal pad 120, shield cover 130, upper thermal pad 140, and heat sink 150. Since heat rises from the chipset 220A the shield cover 210A absorbs heat from the chipset 220A as the shield cover is located directly above and around the chipset 220A. The shield cover blocks EMI between the chipset and other components inside the electronic device. The shield cover can be one or more pieces, different types of materials, etc. however, the shield cover has to be positioned in such a way to block EMI that occurs all around the chipset. This shield cover 210A therefore absorbs heat from the chipset 220A wherein the heat generated by the chipset 220A rises and is absorbed by the multiple layers that exist between the chipset and the heat sink creating an inefficient heat transfer and thermal conduction. The need for a more efficient solution to dissipating heat from the chipset 220A and at the same time shielding the chipset 220A from EMI and noise is desired.

Shielding Wall with Spring Finger Ring

Figure 3:
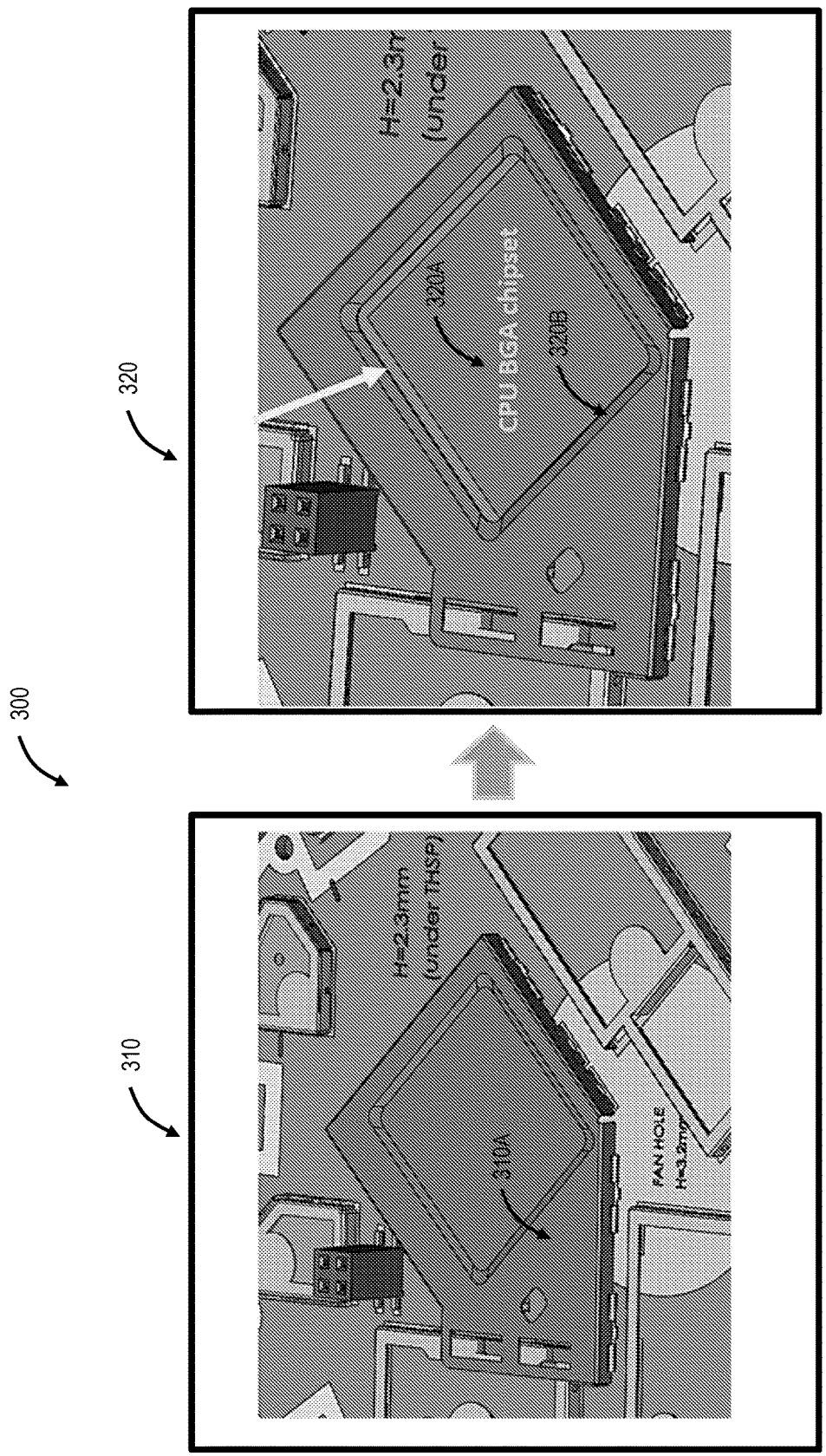
FIG. 3 is a detailed view of the chipset and shield cover modified to allow more efficient heat transfer to the heat sink.

FIG. 3 is a detailed view of the chipset and shield cover modified to allow more efficient heat transfer to the heat sink. The detailed view on the left 310 depicts the existing industry implementation where the shield cover 310A affects the thermal conductivity from chipset to heat sink. The heat sink is not shown in this view but would be located above the shield cover 310A and include a thermal pad between the shield cover 310A and the heat sink. Heat rises from the chipset to the heat sink and when there exists many component layers as described in 100 those layers reduce the thermal conductivity. One solution to achieving better thermal conductivity is to open the shield cover 320B above the chipset 320A as shown in 320, wherein the chipset 320A and the heat sink could be in better contact with one another with only a thermal pad in between. By eliminating the shield cover layer and one thermal pad layer above the chipset 320A the heat transfer from chipset 320A to heat sink located above the chipset would be much more efficient. The consequence of opening a void in the shield cover 320B is the chipset would not have EMI and noise shielding directly above thereby introducing the potential for EMI and noise interference.

Figure 4:
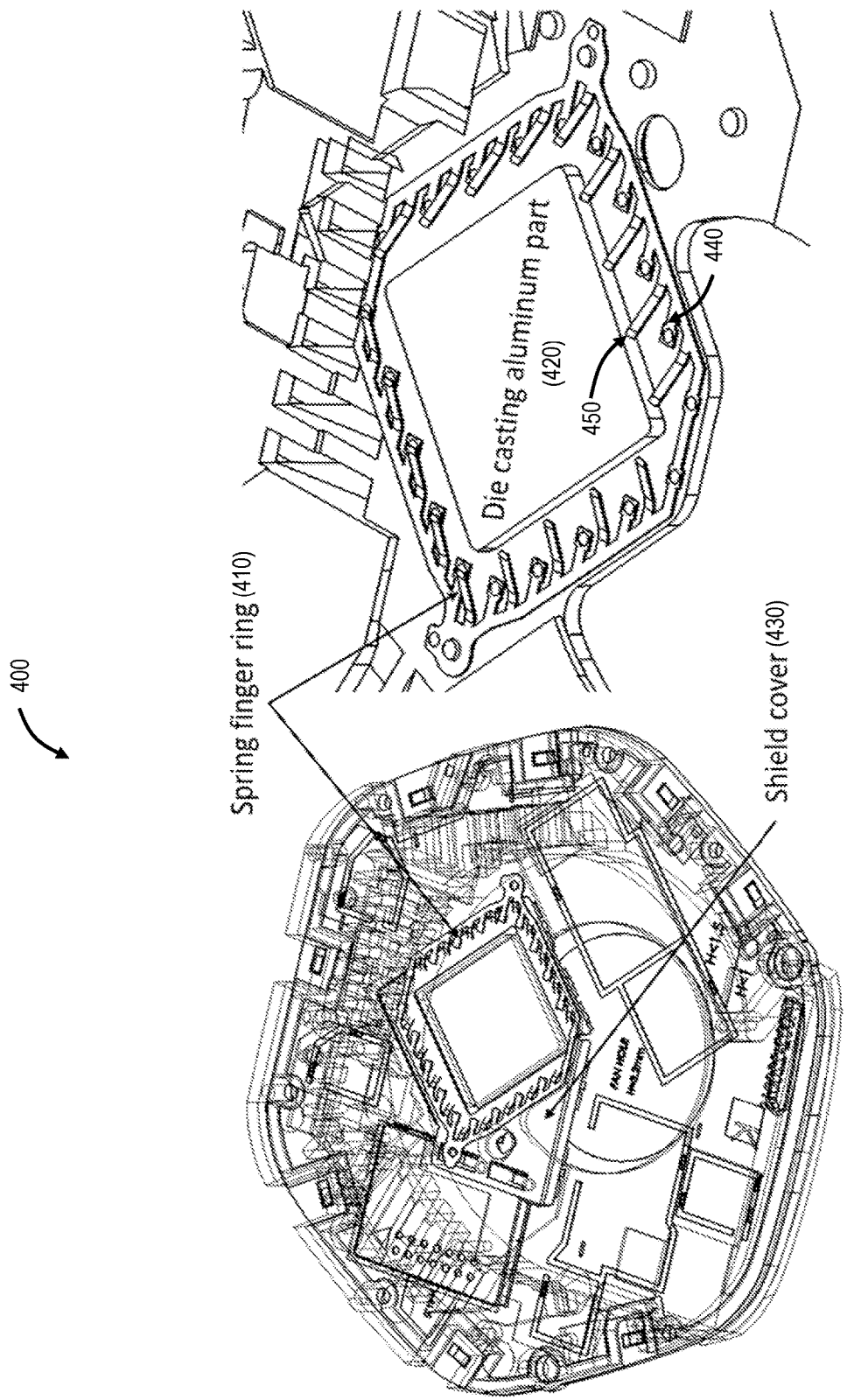
FIG. 4 is a perspective view of a spring finger ring shielding wall implemented with a chipset in an electronic device.

FIG. 4 is a perspective diagram of a novel spring finger ring shielding wall implemented with a chipset in an electronic device. The view on the left shows the electronic device with chipset underneath the shield cover 430, wherein the detail on the right of the drawing shows the die cast aluminum heat sink 420 with spring finger ring 410 shown with further detail. As described in 300 the most efficient heat transfer method between the chipset and the heat sink would be to open up the shield cover above the chipset and have the chipset in direct contact with the heat sink with only a thermal pad between. This solution of opening a void in the shield cover 430 would reduce the shielding benefit to the chipset as the top of the chipset would be vulnerable to noise and EMI without the shielding means. The solution presented includes a metallic ring that would exist between the shield cover 430 and the die cast aluminum heat sink 420 including spring fingers 410 wherein heat can flow out between the air gaps that exist between the spring fingers but noise and EMI will be blocked by the metallic fingers. The spring finger ring 410 can be laser welded onto the die cast aluminum heat sink 420 by welding the fixed portion of the shielding wall (stationary short fingers 440). The other end of the ring which includes the long elastic spring fingers 450 which are in contact with the shield cover 430 and the spring fingers elasticity would act to press the die cast aluminum heat sink 420 to the chipset with only the thermal pad between. The shielding wall portion that attaches to the die cast aluminum heat sink 420 and the spring fingers that attach to the shield cover 430 would have an air gap between them which would allow hot air to rise away from the chipset but also aid in preventing noise and EMI between the chipset and other components in the electronic device.

The shielding wall including spring finger ring 410 acting with the die cast aluminum heat sink 420 and the shield cover 430 provides the necessary shielding from EMI but also makes for a more efficient heat transfer using thermal convection between the chipset and the surrounding environment inside the electronic device.

The plurality of spring fingers that make up the shielding wall are small mechanical parts that have an upward projecting pitch that allows the long spring finger 450 to be pre-loaded in relation to the stationary short fingers 440 that are attached to the die cast aluminum heat sink 420. The long spring fingers 450 are elastic in that when pressed down upon will go back to form if uncompressed. The thickness, height, and material used for the spring fingers will affect the compression rate. The material that makes up the spring fingers and shielding wall can be of any metallic material that can aid in blocking of EMI and noise. The air gap between the elastic shielding fingers 450 are design parameters that can affect the air flow and EMI/noise intrusion blocking ability. The air gap can be modified based on the specific application which can be affected by the heat generated by the chipset, EMI/noise that exist inside the electronic enclosure, etc.

Figure 5:
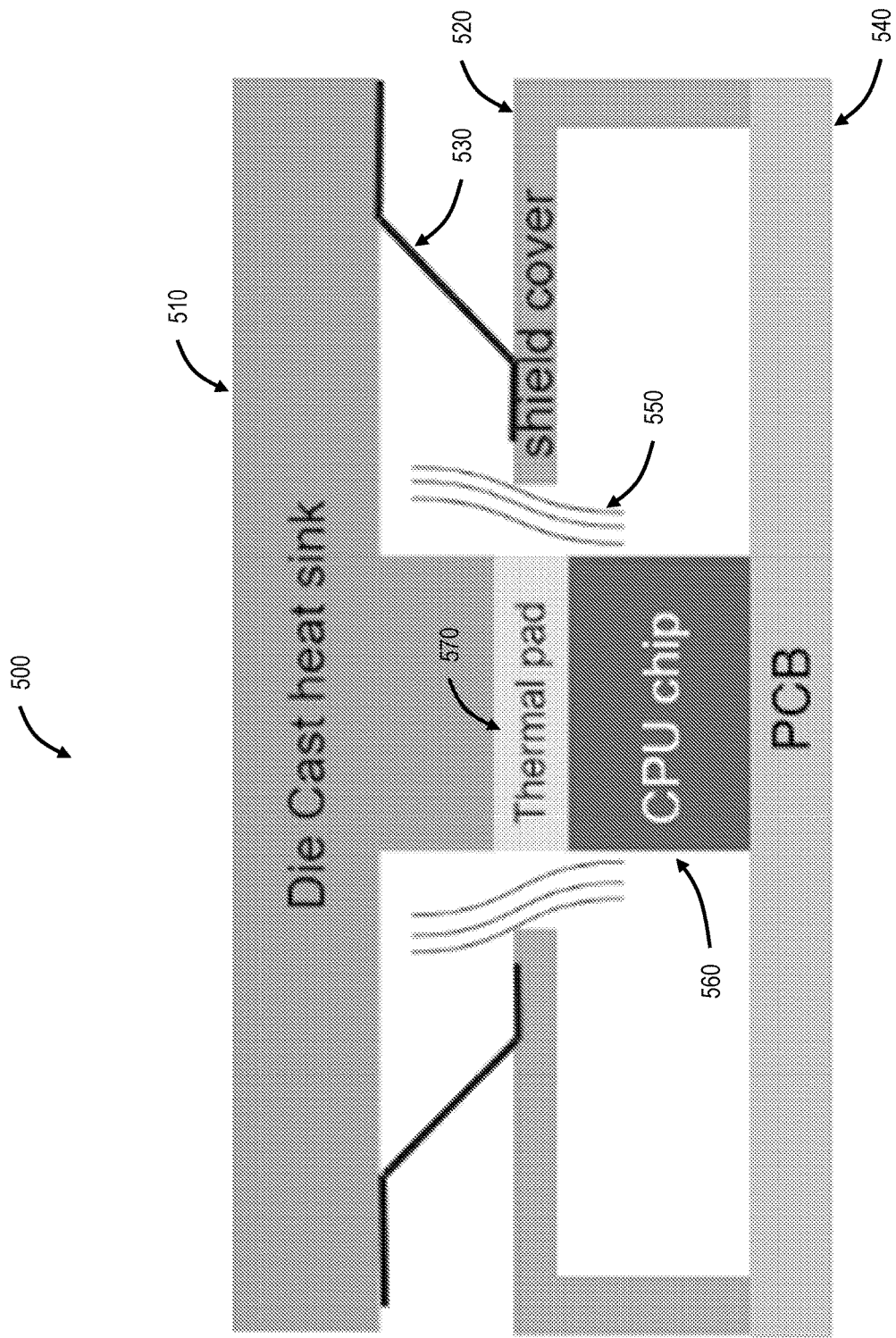
FIG. 5 is a section view illustration of the spring finger ring shielding wall implemented with the shield cover and heat sink.

FIG. 5 is a section view illustration of the spring finger ring shielding wall implemented with the shield cover and heat sink. As shown in 500 the chipset (CPU chip) 560 is installed on top of the PCB 540 by using a surface mounting technology (SMT). As part of the disclosed the shield cover 520 is opened directly above the chipset to create a shielding void above the chipset 560. This void in the shield cover 520 allows the die cast aluminum heat sink 510 to be installed directly in contact with the chipset 560 with only a thermal pad 570 installed between.

In an embodiment, a spring finger ring 530 is installed between the shield cover 520 and the die cast heat sink 510. The shield cover void allows heat to rise from the chipset 550 and flow out between the shield cover 520 and die cast heat sink 510 by the air gap between the spring finger ring 530 elastic fingers. This air transmissive shielding wall that is produced by the spring finger ring 530 assists with the convective heat transfer and also provides noise and EMI shielding. The reduction in heat transmissive layers that existed in 100 also allows more efficient conductive heat transfer from the chipset 560 to the die cast aluminum heat sink 510 further dissipating heat from the chipset 560 to the electronic device environment. This arrangement provides both better thermal conduction between chipset 560 and heat sink 510 in addition better thermal convection occurs between chipset 560 and the surrounding environment inside the electronic device.

Figure 6:
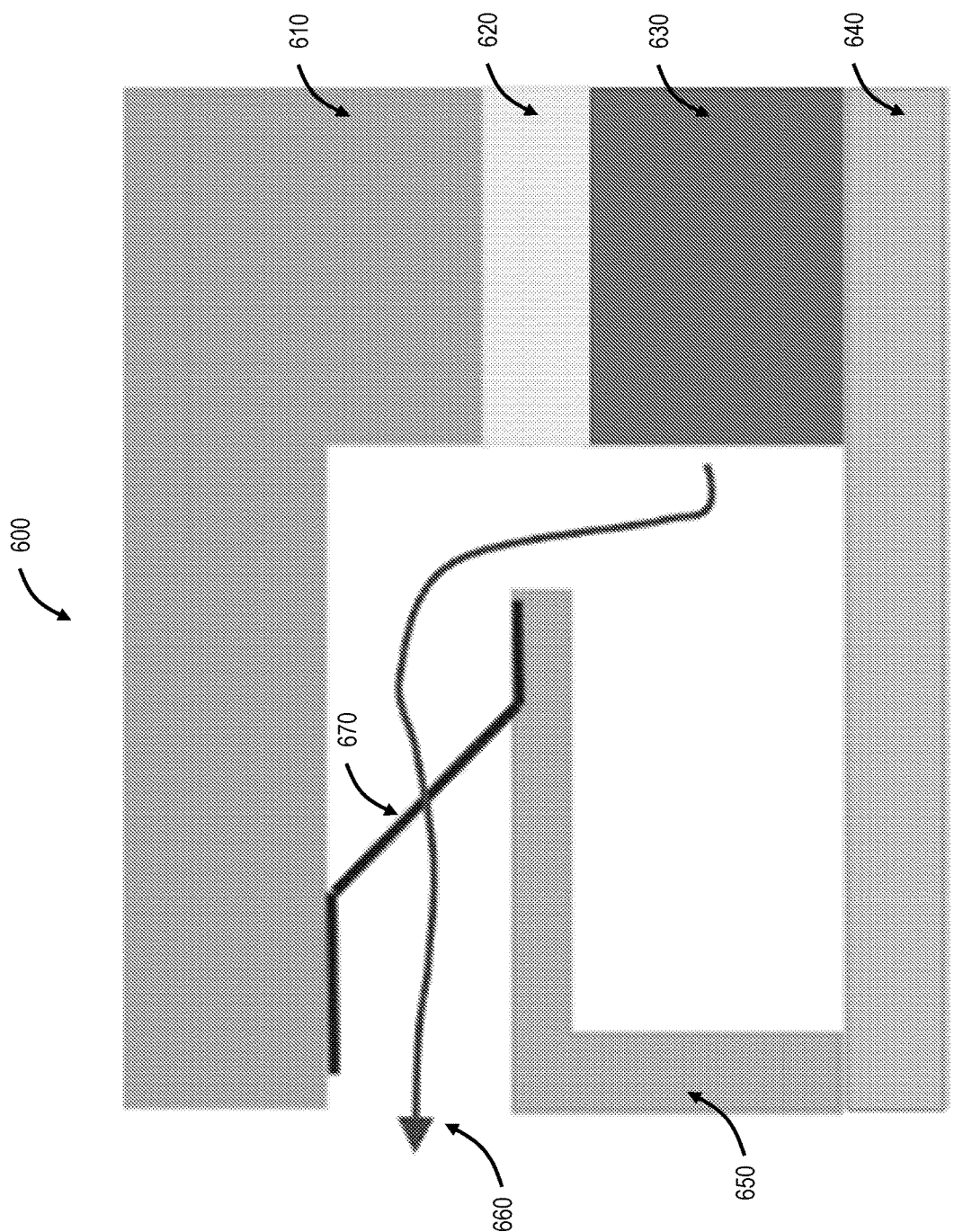
FIG. 6 is a cross-sectional illustration of an embodiment of the spring finger ring shielding wall of FIG. 5.

FIG. 6 is a cross-sectional illustration of an embodiment of the spring finger ring shielding wall of FIG. 5. This cross-section includes the die cast heat sink 610 pressed against the thermal pad 620, and in contact with the chipset 630 which is surface mounted to the PCB 640. When comparing the disclosed heat sink assembly to the existing industry thermal dissipation arrangement it should be clear that the heat produced by the chipset 110 in the existing industry shield cover would get trapped below the shield cover 130 as the shield cover 130 is located above and surrounding the chipset. As described in the disclosed this new shield cover 650 which includes a void above and around the chipset 630 allows the hot air represented by the arrow line 660 to rise and dissipate through the spring finger shielding wall 670. The shielding wall 670 shown in this cross-sectional illustration is represented as a single line however it includes many spring fingers which have air gaps between them as depicted in FIG. 3. The air gaps between the elastic spring fingers allow heat to escape but are arranged such that they provide the necessary shielding to prevent noise and EMI from passing through in either direction. The heat produced by the chipset 630 is transferred to the heat sink which functions much more efficiently than existing industry implementations as there is only one thermal pad that exists between the heat source (chipset 630) and the heat dissipation device (die cast heat sink 610). This design can be implemented with many different types, shapes, functions of chipsets as well as many different types and shapes of heat sinks.

Implementation of the Shielding Wall with Spring Finger Ring

Figure 7:
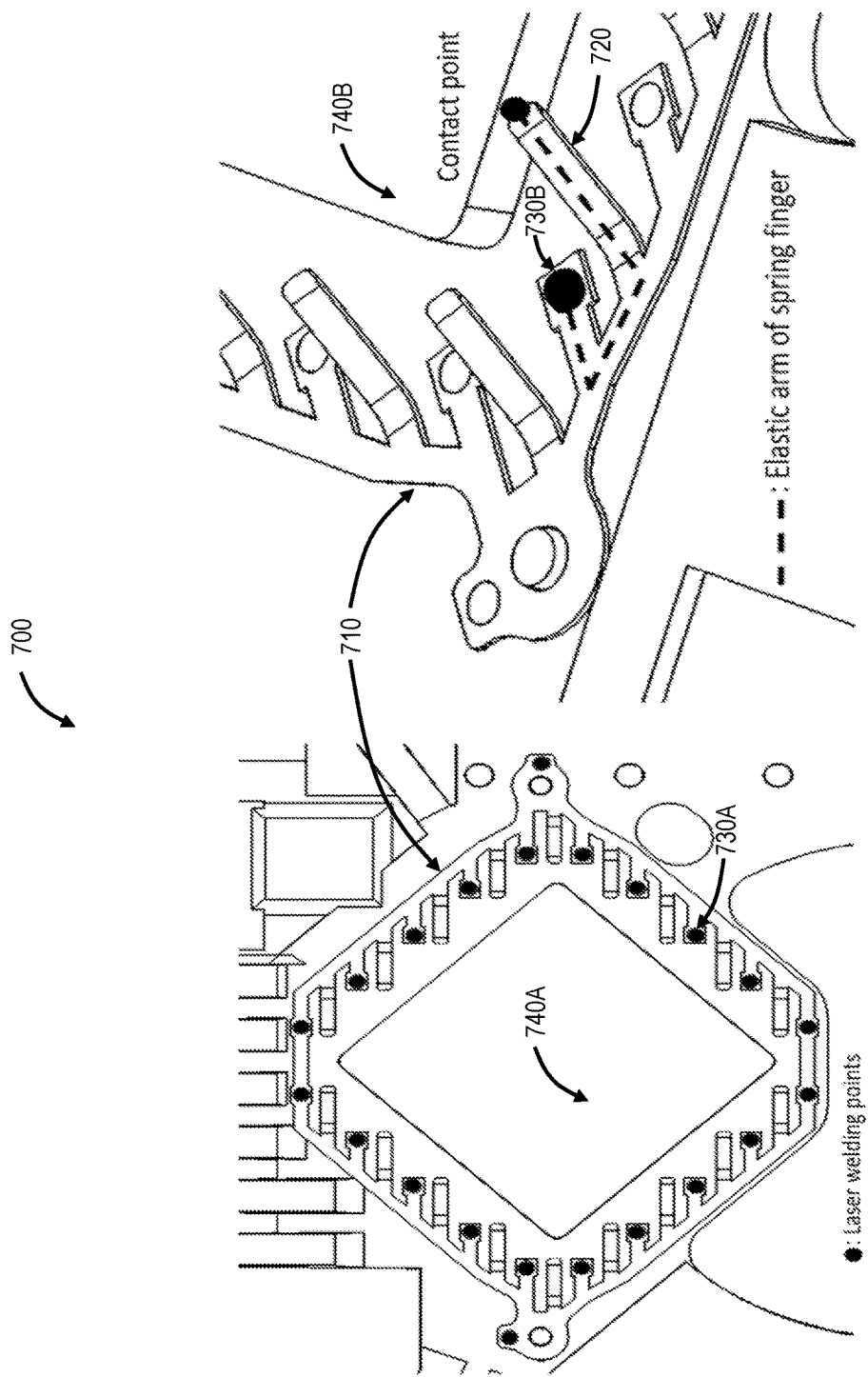
FIG. 7 is a detailed view of the spring finger ring shielding wall including attachment methods to the heat sink and shield cover.

FIG. 7 is a detailed view of the spring finger ring shielding wall including attachment methods to the heat sink and shield cover. The detailed view shown depicts the heat sink and shielding wall assembled together with details on attachment methods and details on the implementation of the spring finger ring that is part of the shielding wall. The assembled spring finger ring shielding wall is shown in 700 with an overall view depicting how the shielding wall is attached to the heat sink on the left side of the drawing and a detailed view of the spring fingers on the right side of the drawing. The spring finger ring shielding wall 710 is attached to the die cast aluminum heat sink (740A,740B) by laser welding the fixed portion of the shielding wall (stationary short fingers) (730A, 730B) as shown in the view represented by filled circles 730A, 740B. The stationary short spring fingers alternate with the long spring fingers around the shielding wall to form a ring around the chipset. Laser welding is a low heat, low force, and non-contacting form of welding electronic components. Laser welding is well suited for automated assembly of components and can ensure a repeatable quality result. It should be noted that the heat sink is made of aluminum and the spring fingers made of stainless steel allowing those components to be laser welded to one another. The long elastic spring fingers 720 are used for contact to the shield cover wherein elasticity is created between the welded stationary short finger and the contact point of the long finger such that this assembled part can be lowered onto the shielding wall and be pressed against by compression that is a result of the elasticity of the spring finger arm.

The die cast aluminum heat sink (740A,740B) can be any orientation, size, and assembly type and can include an overall enclosure lid or an individual heat sink for the individual chipset. The elasticity of the long spring fingers are shown with a dotted line 720 and is formed by the U shaped loop that is formed between the short stationary finger laser welded connection to the die cast aluminum heat sink and the contact point of the long finger to the shield cover. The long spring finger is oriented in such a way which is elevated at a certain degree to the short stationary finger such that the overall assembled component which includes the die cast aluminum heat sink (740A,740B) and spring finger shielding wall can be attached by compressing the assembly together. The long finger compression that occurs between the spring finger ring shielding wall and the shield cover is enough pressure to make contact between the heat sink and the chipset. The spring finger compression that is desired is affected by the design of the spring finger ring which including fundamental mechanical properties such as the elastic modulus.

Figure 8:
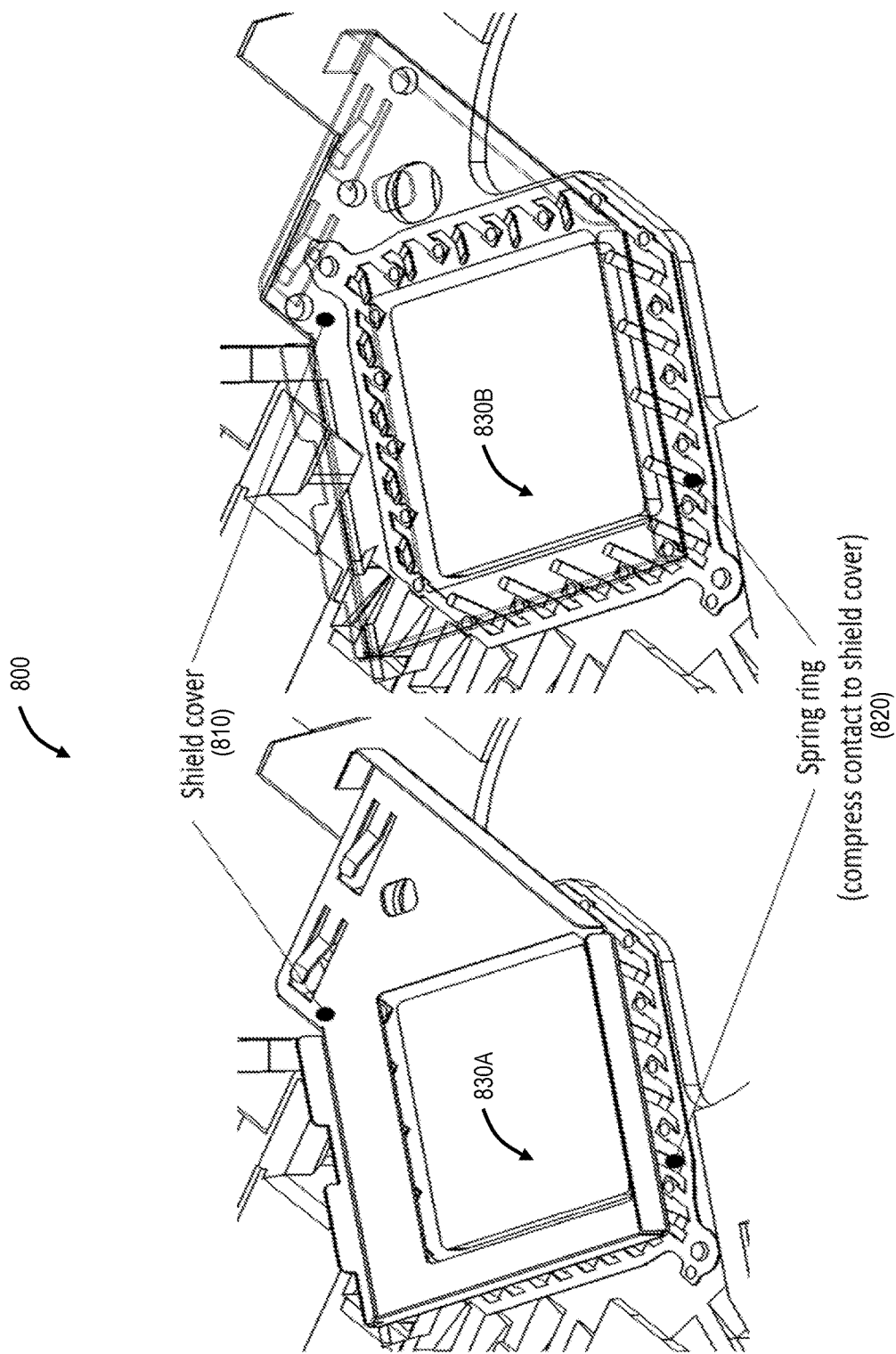
FIG. 8 is a detailed view of the spring finger ring compressed against the shield cover.

FIG. 8 is a detailed view of the spring ring compressed against the shield cover. The spring ring that is part of the shielding wall is shown compressed to contact the shield cover (810). The illustration on the right depicts the shield cover assembled to the spring ring shielding wall and the left illustration depicts the same shield cover in a transparent view. This spring ring shielding wall is assembled to the die cast aluminum heat sink by laser welding the stationary short fingers to the heat sink 830A, 830B. The assembled heat sink and shielding wall is shown with the shield cover 810 attached and illustrates the compression technique that is utilized. The shield cover 810 includes the opening (void) to allow the heat sink 830A, 830B to penetrate through the shield cover and be mounted directly onto the chipset with only a thermal pad between. The long elastic fingers deform as the shield cover 810 is attached and allows the shield cover 810 to be compressed to the shielding wall wherein the heat sink can be pressed against the chipset. The spring fingers are compressed but air gaps exist between the spring fingers allowing heat from the chipset to rise and escape thereby optimizing thermal convection for the chipset. Thermal convection is optimized by the heat dissipating through the spring fingers and the void in the shield cover allows the heat sink to connect directly to the chipset with only a thermal pad between which optimizes the thermal conduction. Heat is dissipated in two paths with this method, through the spring finger ring using thermal convection and through the aluminum heat sink using thermal conduction. Since aluminum has high thermal conductivity reducing the number of layers that exist between the chipset and the heat sink optimizes thermal conduction. The shield cover 810 can be secured in any number of ways including screw, clips, etc.

CONCLUSION

It will be appreciated that some embodiments described herein may include one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application-Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured or adapted to," "logic configured or adapted to," etc. perform a set of operations, steps, methods, processes, algorithms, functions, techniques, etc. on digital and/or analog signals as described herein for the various embodiments.

Moreover, some embodiments may include a non-transitory computer-readable storage medium having computer readable code stored thereon for programming a computer, server, appliance, device, processor, circuit, etc. each of which may include a processor to perform functions as described and claimed herein. Examples of such computer-readable storage mediums include, but are not limited to, a hard disk, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory), Flash memory, and the like. When stored in the non-transitory computer-readable medium, software can include instructions executable by a processor or device (e.g., any type of programmable circuitry or logic) that, in response to such execution, cause a processor or the device to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims. Moreover, it is noted that the various elements, operations, steps, methods, processes, algorithms, functions, techniques, etc. described herein can be used in any and all combinations with each other.

What is claimed is:

1. A heat sink assembly comprising:
   a shield cover having a void present above a chipset;
   a heat sink that fully occupies the void in the shield cover allowing the heat sink to be pressed against the chipset with a single layer thermal pad between; and
   a shielding wall including a plurality of elastic spring fingers, the spring fingers arranged around the periphery of a base of the shielding wall and in contact with the heat sink and the shield cover;
   wherein the shielding wall encircles the chipset and is positioned between the shield cover and the heat sink to provide Electromagnetic Interference (EMI)/noise shielding in addition to providing thermal convection for the chipset.

2. The heat sink assembly of claim 1, wherein the plurality of elastic spring fingers have an air gap between one another for heat to escape and to block EMI/noise from penetrating the chipset.

3. The heat sink assembly of claim 1, wherein the plurality of spring fingers have elasticity and aid in compressing the heat sink to the chipset.

4. The heat sink assembly of claim 3, wherein the shielding wall includes a ring of elastic arms, each elastic arm comprising one end that is stationary and laser welded onto the heat sink and another end that is in contact with the shield cover.

5. The heat sink assembly of claim 4, wherein the stationary arm and the ring of elastic arms together form a U shape and provide elasticity.

6. The heat sink assembly of claim 3, wherein the spring finger ring is a metallic material.

7. The heat sink assembly of claim 6, wherein the metallic material is stainless steel.

8. The heat sink assembly of claim 1, wherein the chipset is in contact with the PCB on one end by surface mounting technology.

9. The heat sink assembly of claim 8, wherein the mounting technology is a ball grid array (BGA).

10. The heat sink assembly of claim 1, wherein the chipset is in contact with the heat sink via the thermal pad.

11. The heat sink assembly of claim 1, wherein the heat sink is an aluminum die cast.

12. The heat sink assembly of claim 1, wherein the shielding wall is electrically connected to ground through a plurality of points around the ring.

13. The heat sink assembly of claim 1, wherein a plurality of heat sink assemblies are implemented in a single electronic device.

14. A method comprising:
providing a shield cover having a void present above a chipset;
placing a heat sink fully over the void in the shield cover allowing the heat sink to be pressed against the chipset with a single layer thermal pad between; and
providing a shielding wall including a plurality of elastic spring fingers, the spring fingers arranged around the periphery of a base of the shielding wall and in contact with the heat sink and the shield cover;
wherein the shielding wall encircles the chipset and is positioned between the shield cover and the heat sink to provide Electromagnetic Interference (EMI)/noise shielding in addition to providing thermal convection for the chipset.

15. The method of claim 14, wherein the plurality of elastic spring fingers have an air gap between one another for heat to escape and to block EMI/noise from penetrating the chipset.

16. The method of claim 14, wherein the plurality of spring fingers have elasticity and aid in compressing the heat sink to the chipset.

17. The method of claim 14, wherein the chipset is in contact with the PCB on one end by surface mounting technology.

18. The method of claim 14, wherein the chipset is in contact with the heat sink via the thermal pad.

19. The method of claim 14, wherein the heat sink is an aluminum die cast.

20. The method of claim 14, wherein the shielding wall is electrically connected to ground through a plurality of points around the ring.

* * * * *